United States Patent
Koh et al.

(10) Patent No.: US 6,599,844 B2
(45) Date of Patent: Jul. 29, 2003

(54) METHOD AND FORMING FINE PATTERNS OF SEMICONDUCTOR DEVICES USING PASSIVATION LAYERS

(75) Inventors: Cha-Won Koh, Ichon-shi (KR); Cheol-Kyu Bok, Ichon-shi (KR)

(73) Assignee: Hyundai Electronics Industries, Co., Ltd., Ichon-shi (KR)

(*) Notice: Subject to any disclaimer, the term of this patent is extended or adjusted under 35 U.S.C. 154(b) by 0 days.

(21) Appl. No.: 09/886,463

(22) Filed: Jun. 22, 2001

(65) Prior Publication Data

US 2002/0006585 A1 Jan. 17, 2002

(30) Foreign Application Priority Data

Jun. 22, 2000 (KR) .......................... 2000-34599

(51) Int. Cl.$^7$ .................... H01L 21/00; H01L 21/302
(52) U.S. Cl. ........................... 438/725; 430/314
(58) Field of Search ..................... 430/314; 438/725

(56) References Cited

U.S. PATENT DOCUMENTS

| | | | | |
|---|---|---|---|---|
| 4,803,181 A | * | 2/1989 | Buchmann et al. | 148/DIG. 111 |
| 5,362,606 A | * | 11/1994 | Hartney et al. | 430/302 |
| 6,100,014 A | * | 8/2000 | Lin et al. | 430/314 |

\* cited by examiner

*Primary Examiner*—William David Coleman
(74) *Attorney, Agent, or Firm*—Pillsbury Winthrop LLP

(57) ABSTRACT

A method is disclosed for forming fine photoresist patterns on semiconductor devices using a modified, two-step dry develop process using a fluorine-containing gas to produce hydrophobic $SiO_x$ passivation layers on the sidewalls of the photoresist patterns. These passivation layers increase the structural stability of the fine photoresist patterns and prevent moisture within an air from cohering on the photoresist patterns when the semiconductor substrate is subsequently exposed to the air. Accordingly, the present invention improves the processing margins for very high aspect ratio photoresist patterns resulting in reduced rework and increased yield on very highly integrated semiconductor devices.

17 Claims, 3 Drawing Sheets

METHOD AND FORMING FINE PATTERNS OF SEMICONDUCTOR DEVICES USING PASSIVATION LAYERS

FIELD OF THE INVENTION

The present invention relates to a method for forming fine patterns for semiconductor devices; and, more particularly, to a method for preventing the collapse of the fine patterns during subsequent processing for example a dry-etching process.

DESCRIPTION OF THE PRIOR ART

Generally, the ability to form fine patterns for highly integrated circuits is essential to the manufacture of semiconductor devices. In particular, the ability to form a fine and stable photoresist pattern is critical to the successful implementation of a semiconductor manufacturing process. As the level of integration increases, particularly for semiconductor memory devices having a high capacity of 1 Gbit or more are fabricated, the likelihood of increased levels of photoresist pattern disruption should be considered for possible effects on the device yield.

Typically, the disruption of a photoresist pattern results from one of two causes. In the first instance, the photoresist patterns peel off the substrate as a result of poor adhesion between the semiconductor substrate and the photoresist patterns. In the second instance, the photoresist patterns themselves do not possess sufficient structural stability and tend to fall, bend or break, thereby causing pattern defects that require rework or result in device failure. The collapse of the photoresist patterns is frequently thought to be related to the increases in aspect ratio required to achieve the desired level of integration of semiconductor devices. This higher aspect ratio results in tall, narrow photoresist patterns separated by narrow spaces.

The conventional wet development process includes the steps of treating the photoresist patterns using a developer; cleaning the wafer; and drying the wafer using a spin dry method. The photoresist patterns, particularly those with high aspect ratios, may collapse during the wet development process, especially during the spin dry process. In the spin dry process, the abrupt vaporization of the deionized water induces an attraction between adjacent photoresist patterns. Accordingly, if the photoresist patterns do not have sufficient strength to resist this attraction, the photoresist patterns may easily collapse. Typically, this attraction is in proportion to the surface tension of the deionized water and the aspect ratio of the photoresist patterns is in inverse proportion to a radius of a curved surface of the deionized water.

The dry development process is superior in allowing photoresist patterns having high aspect ratios to be processed without the pattern collapse that would result from a wet development process. However, as the aspect ratio increases, the likelihood of fine photoresist patterns collapsing or bending tends to increase even with a dry development process. In particular, photoresist patterns from a dry development process tend to be more prone to bending than collapsing. It is suspected that this tendency for dry-developed photoresist patterns to bend may be the result of moisture from the air cohering to the surface of the photoresist patterns.

Although the dry development process is superior to the wet development process in preventing the photoresist patterns from collapsing, the conventional dry development process still experiences problems with bending photoresist patterns as a result of moisture from the air cohering on the pattern surface.

SUMMARY OF THE INVENTION

It is, therefore, an object of the present invention to provide a method for forming fine patterns of photoresist film using a dry development process that more effectively resists a bending of the photoresist patterns.

It is another object of the present invention to provide a method for preventing moisture from cohering to photoresist patterns formed with a dry development process and then improving the reappearance of the resulting photoresist patterns.

In accordance with an aspect of the present invention, there is provided a method for forming fine, high aspect ratio patterns in semiconductor device, the method comprising the steps of: a) forming photoresist patterns using a first dry development process; and b) forming passivation layers on the sidewalls of the first photoresist patterns with a second dry development process using a fluorine-based gas, wherein the passivation layers are hydrophobic $SiO_x$ layers that prevent moisture from the air from cohering to the photoresist patterns when the semiconductor substrate is exposed to the air.

In the present invention, the first dry development process comprises the steps of: a1) forming a photoresist film for top surface imaging on a film to be patterned; a2) performing a first bake process to the photoresist film to remove solvent contained in the photoresist film; a3) selectively esposing photoresist film using a photomask; a4) performing a second bake process to the photoresist film; a5) forming silylation layers on the exposed surfaces of the photoresist film using a silylation agent; and a5) etching the photoresist film using the silylation layers as an etching mask.

BRIEF DESCRIPTION OF THE DRAWINGS

Other objects and aspects of the present invention will become apparent from the following description of the embodiments with reference to the accompanying drawings, in which.

DETAILED DESCRIPTION OF THE PREFERRED EMBODIMENTS

Hereinafter, the present invention will be described in detail referring to the accompanying drawings.

Figure 1A:
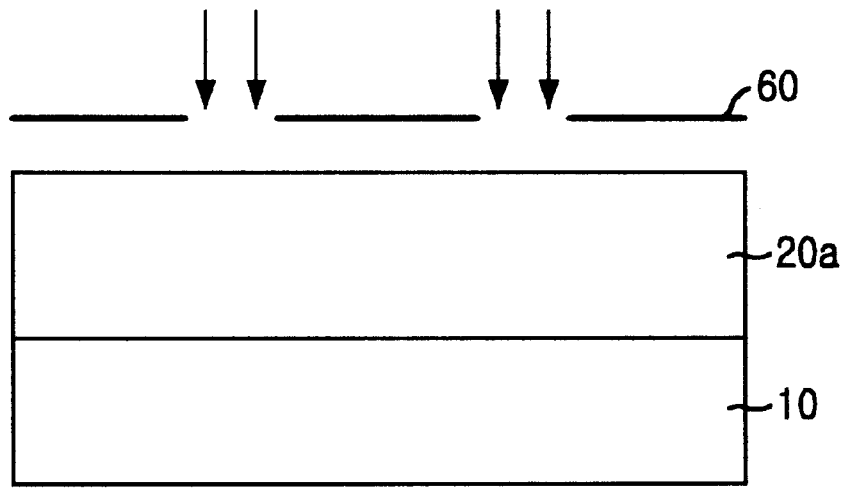
FIGS. 1A to 1D are cross-sectional views illustrating a method for forming fine photoresist patterns according to the present invention.

First, referring to FIG. 1A, a film 10 to be patterned is formed on a semiconductor substrate (not shown) and a vapor treatment using hexamethyldisiazane (HMDS) is applied to a surface of the film 10 in order to increase the adhesion between the film 10 and the photoresist film which will be formed thereon. A photoresist film 20a suitable for top surface imaging is then formed on the film 10. The photoresist film 20a is applied to a thickness of approximately 2,000 Å to 12,000 Å and is then subjected to a soft-bake process to reduce the solvent in the photoresist film 20a. At this step, a first bake process is carried out for 10 to 300 seconds at a temperature of 80 to 250° C.

The photoresist film 20a is then exposed in a stepper using a pattern mask 60 (or reticle) and a light source selected from the group consisting of I-line, ArF, 157 nm-wevelength, X-ray and E-beam light sources. A second bake process is then performed on the photoresist film 20a for 60 to 350 seconds at a temperature of 70 to 200° C.

Figure 1B:
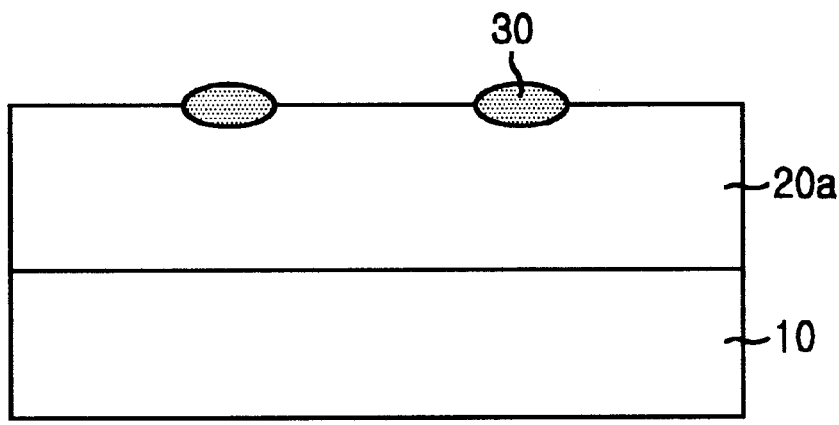

Next, referring to FIG. 1B, silylation layers 30 are formed in the top portion of the exposed photoresist film 20a using a silylation agent for about 120 seconds at a temperature of about 120° C. The silylation agent is preferably selected from the group consisting of TMDS,(1,1,3,3-tetramethyl disilazane); TMSDMA, (n,n-dimethylamine-trimethylsilane); TMSDEA, (n,n-diethylaminotrimethyl-amine); B[DMA]DS, (bis(dimethylamino) dimethylsilane); and B[DMA]MS, ((bis(dimethylamino) methylsilane).

Figure 1C:
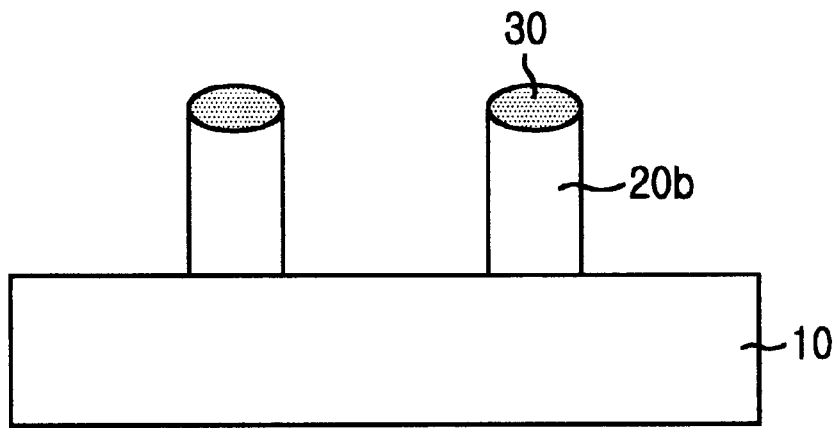

Referring to FIG. 1C, a first dry development process is carried out in order to form photoresist patterns 20b. In the preferred embodiment of the present invention, a TCP 9400SE may be used for the dry development process. In the first dry development process, a first dry etching process for etching the photoresist film 20a is carried out using $O_2$ or a mixed gas of $SO_2/O_2$ as an etchant and using the silylation layers 30 as an etching mask, thereby forming photoresist patterns 20b. The detailed recipes for the first dry development process are as follows:

Temperature: −50 to 10° C.

Pressure: 1 to 50 mTorr

Power of upper electrode: 50 to 2,000 W

Power of lower electrode: 10 to 500 W

Power of bias: 10 to 150 W

After the first dry development process using an oxygen-containing gas, the silylation layers 30 are changed into silicon oxide layers 40.

Figure 1D:
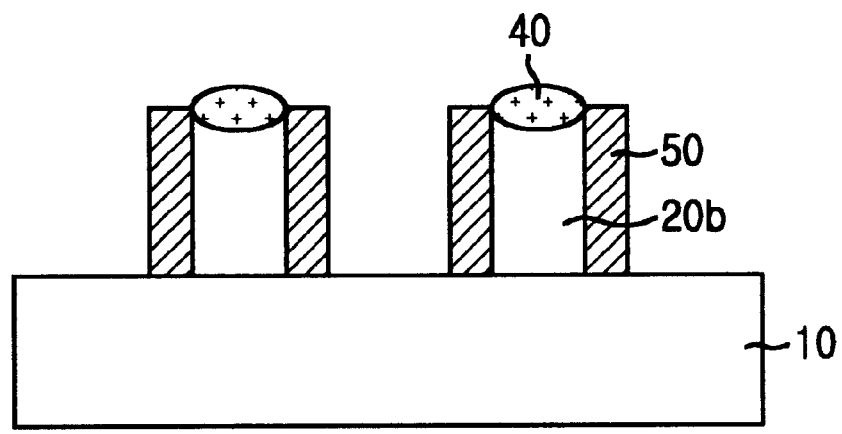

Referring to FIG. 1D, a second dry development process is carried out for 3 to 7 seconds using a gas mixture including a fluorine-containing gas such as $C_2F_6/O_2$ or $CF_4/O_2$ and under the following conditions:

Temperature: −50 to 10° C.

Pressure: 1 to 50 mTorr

Power of upper electrode: 50 to 2,000 W

Power of lower electrode: 10 to 500 W

Power of bias: 10 to 150 W

As a result of the second dry development process, passivation layers 50 are formed on the sidewalls of the photoresist patterns 20b. These passivation layers 50 comprising hydrophobic $SiO_x$ layers, prevent moisture from the air from cohering to the photoresist patterns 20b when the semiconductor substrate is exposed to the air. Accordingly, the passivation layers 50 strengthen the physical properties of the photoresist patterns 20b, decreasing the chance that the patterns will collapse, fall or bend.

Figure 2:
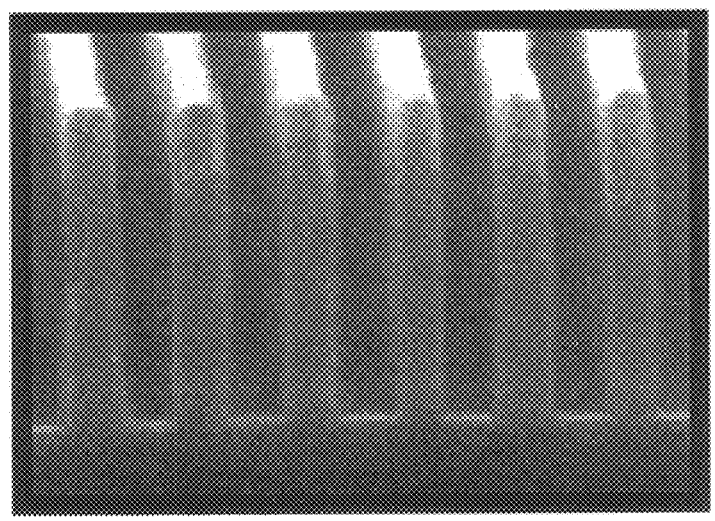
FIG. 2 is a SEM photograph showing a cross section of photoresist patterns having the passivation layers according to the present invention.
Figure 3:
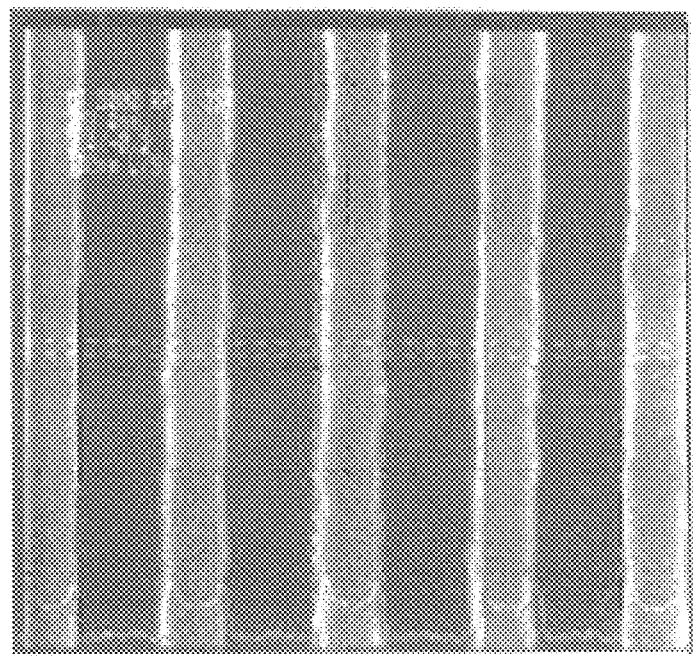
FIG. 3 is a SEM photograph showing a layer out of photoresist patterns having passivation layers according to the present invention.

FIG. 2 is a SEM photograph showing a cross section of the photoresist patterns having the passivation layers formed according to the present invention on a $Sio_2$ film. FIG. 3 is a SEM photograph showing a top view of the photoresist patterns having the passivation layers according to the present invention on a $SiO_2$ film. As shown in FIGS. 2 and 3, the photoresist patterns formed using the second dry development process according to the present invention can effectively form fine photoresist pattern without experiencing any falling or bending of the photoresist patterns.

As apparent from the above, the present invention makes it possible to form fine photoresist patterns by preventing moisture within an air from cohering to the developed photoresist patterns. Accordingly, the present invention may be used to increase the degree of integration of a semiconductor device by providing a method for forming fine photoresist patterns having a line width of 0.10 μm or less with hydrophobic passivation layers and thereby improving the appearance of the fine patterns Although the preferred embodiments of the present invention have been disclosed for illustrative purposes, those skilled in the art will appreciate that various modifications, additions and substitutes are possible, without departing from the scope and spirit of the present invention as described in the accompanying claims.

What is claimed is:

1. A method for forming fine photoresist patterns on a first film, the method comprising the sequential steps of:
    a) forming a photoresist pattern on the first film using a first dry development process, the photoresist pattern comprising upper surfaces and sidewalls; and
    b) forming a passivation layer on the sidewalls of the first photoresist pattern using a second dry development process incorporating a fluorine-containing gas, the passivation layer comprising hydrophobic $SiO_x$, wherein the fluorine-containing gas comprises a $C_2F_6/O_2$ gas mixture and a $CF_4/O_2$ gas mixture.

2. A method for forming fine photoresist patterns according to claim 1, wherein step a) further comprises the steps of:
    a1) forming a photoresist film suitable for a top surface imaging process;
    a2) treating the photoresist film with a first bake, the first bake being sufficient to reduce a solvent from the photoresist film;
    a3) selectively exposing portions of the photoresist film using a photomask to direct the exposure;
    a4) treating the photoresist film with a second bake;
    a5) forming a silylated photoresist pattern by contacting the exposed portions of the photoresist film and a silylation agent; and
    a6) etching the photoresist film using the silylated photoresist pattern as an etching mask.

3. A method for forming fine photoresist patterns as recited in claim 2, wherein the first bake process has a duration of between 10 and 300 seconds at a temperature of 80 to 250° C.

4. A method for forming fine photoresist patterns as recited in claim 2, wherein the photoresist film has a thickness of approximately 2,000 to 12,000 Å.

5. A method for forming fine photoresist patterns as recited in claim 2, wherein the step of selectively exposing portions of the photoresist film comprise illuminating the photoresist film with exposure light from a source selected from the group consisting of I-line, ArF, 157 nm-wavelength, X-ray and E-beam sources.

6. A method for forming fine photoresist patterns as recited in claim 2, wherein the silylation agent is selected from the group consisting of TMDS (1,1,3,3-tetramethyl disilazane), TMSDMA (n,n-dimethylamine-trimethylsilane), TMSDEA (n,n-diethylaminotrimethyl-amine), B[DMA]DS(bis(dimethylamino)dimethylsilane) and B[DMA]MS((bis(dimethylamino)methy-lsilane).

7. A method for forming fine photoresist patterns as recited in claim 2, wherein the second bake has a duration of between 60 and 350 seconds is performed at a temperature of between 70 and 200° C.

8. A method for forming fine photoresist patterns as recited in claim 1, wherein the first dry development process comprises a plasma etch using $O_2$ gas or a mixed gas of $SO_2/O_2$.

9. A method for forming fine photoresist patterns as recited in claim 8, wherein the first dry development process is performed a temperature between approximately −50 and 10° C. and at a pressure between approximately 1 and 50 mTorr.

10. A method for forming fine photoresist patterns as recited in claim 9, wherein the first dry development process is carried out in equipment having power applied to an upper electrode and a lower electrode and a bias power, and further wherein the power applied to the upper electrode is between 50 and 2,000 W, the power applied to the lower electrode is between 10 and 500 W, the bias power being between 10 and 150 W.

11. A method for forming fine photoresist patterns as recited in claim 1, wherein the first dry development process is carried out at a temperature between approximately −50 and 10° C. and at a pressure between approximately 1 and 50 mTorr.

12. A method for forming fine photoresist patterns as recited in claim 11, wherein the first dry development process is carried out in equipment having power applied to an upper electrode and a lower electrode and a bias power, and further wherein the power applied to the upper electrode is between 50 and 2,000 W, the power applied to the lower electrode is between 10 and 500 W, the bias power being between 10 and 150 W.

13. A method for forming fine photoresist patterns as recited in claim 2, further comprising the step of treating a surface of the first film with HMDS (hexamethyldisiazane) vapor before forming the photoresist film, the treatment increasing an adhesive strength between the first film and the photoresist film.

14. A method for forming fine patterns on a semiconductor device, the method comprising the steps of:

a) forming a device layer on the semiconductor substrate;

b) forming a photoresist layer on the device layer;

c) selectively exposing surface portions of the photoresist layer to light energy, thereby forming exposed regions and unexposed regions on the surface of the photoresist layer;

d) treating the exposed surface portions of the photoresist layer to form a silylated photoresist pattern in an upper portion of the photoresist layer;

e) performing a first dry develop using the silylated photoresist pattern as a mask, thereby removing a portion of the photoresist layer beneath the unexposed regions of the photoresist layer and forming a first photoresist pattern having a silylated upper surface and substantially vertical sidewalls;

f) performing a second dry develop using a fluorine-containing gas to form hydrophobic $SiO_x$ passivation layers on the sidewalls of the first photoresist pattern sufficient to prevent moisture from cohering to the sidewalls wherein the fluorine-containing gas comprises a $C_2F_6/O_2$ gas mixture and a $CF_4/O_2$ gas mixture.

15. A method for forming fine patterns on a semiconductor device according to claim 14, wherein the photoresist layer comprises a solvent and further wherein the step of forming the photoresist layer on the device layer further comprises a step of baking the photoresist layer to remove a portion of the solvent;

the step of selectively exposing surface portions of the photoresist layer to light energy further comprises positioning a photomask between the photoresist layer and a light source; and the step of treating the exposed surface portions of the photoresist layer to form a silylated photoresist pattern further comprises a second step of baking the photoresist layer and applying a silylation agent to the exposed surface portions of the photoresist layer.

16. A method for forming fine patterns on a semiconductor device according to claim 15, wherein the photresist layer has a thickness between about 2,000 Å and 12,000 Å.

17. A method for forming fine patterns on a semiconductor device according to claim 14, further comprising a step of treating the device layer with HMDS before forming the photoresist layer to improve adhesion between the device layer and the photoresist layer.

* * * * *